(12) United States Patent
Nishimura

(10) Patent No.: US 7,723,799 B2
(45) Date of Patent: May 25, 2010

(54) SEMICONDUCTOR DEVICE

(75) Inventor: Motoaki Nishimura, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 296 days.

(21) Appl. No.: 12/017,570

(22) Filed: Jan. 22, 2008

(65) Prior Publication Data

US 2008/0204123 A1  Aug. 28, 2008

(30) Foreign Application Priority Data

Feb. 28, 2007  (JP) .............................. 2007-048625

(51) Int. Cl.
*H01L 29/76* (2006.01)
*H01L 29/94* (2006.01)
*H01L 23/62* (2006.01)

(52) U.S. Cl. .................. 257/372; 257/355; 257/363; 257/371; 257/373; 257/394; 257/547; 257/E27.063; 257/E27.064; 257/E27.067

(58) Field of Classification Search .................. 257/355, 257/363, 371, 372, 373, 394, 547, E27.063, 257/E27.064, E27.067
See application file for complete search history.

(56) References Cited

U.S. PATENT DOCUMENTS 7,190,034 B2 * 3/2007 Hatade et al. ............... 257/371
7,485,931 B2 * 2/2009 Nagatomo ................... 257/363

2007/0170517 A1 * 7/2007 Furukawa et al. ........... 257/372
2008/0188045 A1 * 8/2008 Morris ........................ 438/217

FOREIGN PATENT DOCUMENTS

JP          A 10-32259          2/1998

* cited by examiner

*Primary Examiner*—Dao H Nguyen
(74) *Attorney, Agent, or Firm*—Oliff & Berridge, PLC

(57) ABSTRACT

A semiconductor device includes a P-substrate, an N-well disposed in the P-substrate, an NMOS transistor disposed in the P-substrate and having one of a source and a drain connected to a ground voltage, a P-tap disposed in the P-substrate and connected to a low voltage so as to provide the P-substrate with the low voltage to be lower than the ground voltage, a PMOS transistor disposed in the N-well and having a source connected to a power supply voltage, an N-tap disposed in the N-well and connected to the power supply voltage so as to provide the N-well with the power supply voltage, and a depression-type PMOS transistor having a drain connected to the low voltage and a source connected to the ground voltage so as to prevent a parasitic transistor, which may exist among the PMOS transistor, the N-well, the NMOS transistor, and the P-substrate, from causing a latchup between the power supply voltage and the ground voltage due to the low voltage rising higher than the ground voltage, and for becoming in a conductive state brought by a gate substantially connected to the ground voltage to maintain the low voltage to be substantially at the ground voltage until a possibility that the low voltage rises higher than the ground voltage is eliminated.

6 Claims, 3 Drawing Sheets

SEMICONDUCTOR DEVICE

The entire disclosure of Japanese Patent Application No. 2007-048625, filed Feb. 28, 2007 is expressly incorporated by reference herein.

BACKGROUND OF THE INVENTION

1. Technical Field

Several aspects of the present invention relates to a semiconductor device including an NMOS transistor, a P-tap, a PMOS transistor, and an N-tap provided in a twin-well structure.

2. Related Art

In a semiconductor device S of the related art shown in FIG. 1, a low voltage VEE (e.g., −10V), which should be lower than a ground voltage VSS, and is applied to a P-tap STp for providing the voltage of a P-substrate PS, is generated by a power supply circuit P. The power supply circuit P generates the low voltage VEE by, for example, pumping-up and dividing the power supply voltage VDD (e.g., +2.8V), and at the beginning, namely when the power supply voltage VDD is applied to the power supply circuit P to which the power supply voltage VDD has not been applied yet, the power supply circuit outputs the low voltage VEE after a brief interval from the application of the power supply voltage VDD.

JP-A-10-32259 is an example of a prior art document.

However, in the stage before the power supply circuit P outputs the low voltage VEE, a line of the low voltage VEE is in a so-called "floating" condition, and moreover, under the influences of the application of the power supply voltage VDD and a parasitic capacitance (not shown) which may exist, for example, between an N-well NW to be provided with the power supply voltage VDD and a P-substrate PS to be provided with the low voltage, the low voltage VEE may reach, for example, 0.7V (=(the ground voltage VSS)+(the forward voltage drop of a first parasitic transistor tr1)) or higher. Thus, the first parasitic transistor becomes in a conductive state, and the conductive state causes the base voltage of a second parasitic transistor tr2 to drop, as a result, the second parasitic transistor tr2 also becomes in a conductive state. When both of the first and second parasitic transistors tr1, tr2 become in the conductive state, there arises a problem that a latchup described in the related art document mentioned above, namely a short circuit between the N-tap STn and the NMOS transistor TRn illustrated with an arrow in FIG. 1 might occur.

SUMMARY

According to an aspect of the invention, there is provided a semiconductor device including a P-substrate, an N-well disposed in the P-substrate, an NMOS transistor disposed in the P-substrate and having one of a source and a drain connected to a ground voltage, a P-tap disposed in the P-substrate and connected to a low voltage so as to provide the P-substrate with the low voltage to be lower than the ground voltage, a PMOS transistor disposed in the N-well and having a source connected to a power supply voltage, an N-tap disposed in the N-well and connected to the power supply voltage so as to provide the N-well with the power supply voltage, and a depression-type PMOS transistor having a drain connected to the low voltage and a source connected to the ground voltage so as to prevent a parasitic transistor, which may exist among the PMOS transistor, the N-well, the NMOS transistor, and the P-substrate, from causing a latchup between the power supply voltage and the ground voltage due to the low voltage rising higher than the ground voltage, and for becoming in a conductive state brought by a gate substantially connected to the ground voltage to maintain the low voltage to be substantially at the ground voltage until a possibility that the low voltage rises higher than the ground voltage is eliminated.

According to the semiconductor of this aspect of the invention, since the depression-type PMOS transistor maintains the low voltage to be at the ground voltage until a possibility that the low voltage rises higher than the ground voltage is eliminated, thereby preventing the parasitic transistor from becoming in the conductive state, the latchup described above can be prevented from occurring.

Further, in the semiconductor device according to this aspect of the invention, the depression-type PMOS transistor is switched from the conductive state to a breaking state by application of the power supply voltage to the gate of the depression-type PMOS transistor.

Further, in the semiconductor device according to this aspect of the invention, a CMOS transistor connected to the gate of the depression-type PMOS transistor is further included, and the depression-type PMOS transistor is switched between the conductive state and the breaking state by switching the voltage applied to a gate of the CMOS transistor.

Further, in the semiconductor device according to this aspect of the invention, a power supply circuit for generating a high voltage higher than the power supply voltage from the power supply voltage and the ground voltage is further included, the gate of the depression-type PMOS transistor is connected to the high voltage, and the depression-type PMOS transistor is switched from the conductive state to a breaking state by application of the high voltage to the gate of the depression-type PMOS transistor.

Further, in the semiconductor device according to this aspect of the invention, a discharging transistor disposed between the gate of the depression-type PMOS transistor and the ground voltage and for discharging a charge which may be accumulated in the gate of the depression-type PMOS transistor is further included.

Further, in the semiconductor device according to this aspect of the invention, an external terminal disposed on the gate of the depression-type PMOS transistor, to which a voltage for bringing the depression-type PMOS transistor into the conductive state and a voltage for bringing the depression-type PMOS transistor into the breaking state are selectively applied, is further included.

BRIEF DESCRIPTION OF THE DRAWINGS

The invention will now be described with reference to the accompanying drawings, wherein like numbers refer to like elements.

DESCRIPTION OF THE EMBODIMENTS

Embodiments of a semiconductor device according to the present invention will now be described with reference to the accompanying drawings.

Structure

Figure 1:
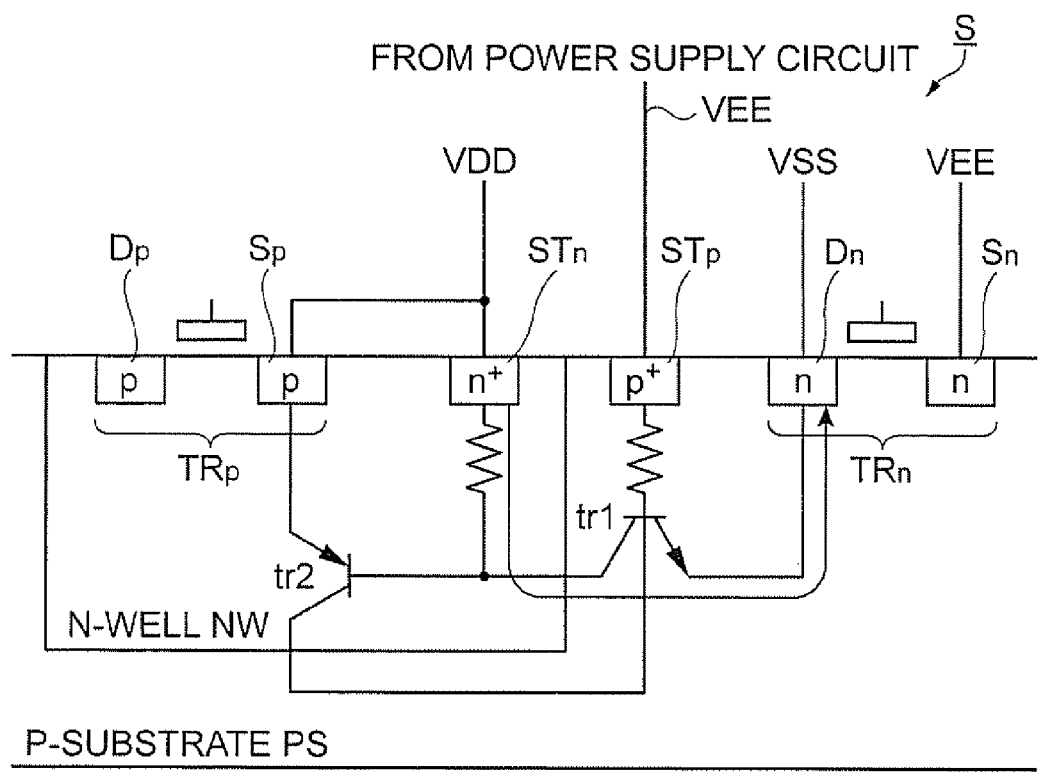
FIG. 1 is a diagram showing a basic configuration of a semiconductor of both an embodiment and the related art.

The semiconductor S of the embodiment has basically the same configuration as the semiconductor device in the related art as shown in FIG. 1. The semiconductor device S of the embodiment, in detail, includes a P-substrate PS, an N-well NW, an NMOS transistor TRn, a PMOS transistor TRp, a P-tap STp, and an N-tap STn, receives a power supply voltage VDD, a ground voltage VSS, and a low voltage VEE which is generated by a power supply circuit P from the power supply voltage VDD and the ground voltage and should be lower than the ground voltage VSS, and operates based on these three voltages VDD, VSS, and VEE.

The power supply circuit P executes, for example, pumping-up and dividing processes on the voltage difference (2.8V) between the power supply voltage VDD and the ground voltage VSS to generate the low voltage VEE described above, and when the power supply voltage VDD is applied to the power supply circuit P to which the power supply voltage VDD has not been applied yet, the power supply circuit starts outputting the low voltage VEE not immediately after the application of the power supply voltage VDD but after a brief interval from the application thereof. Further, a line of the low voltage VEE is in a so-called "floating" condition until the proper low voltage VEE is output by the power supply circuit P.

Figure 5:
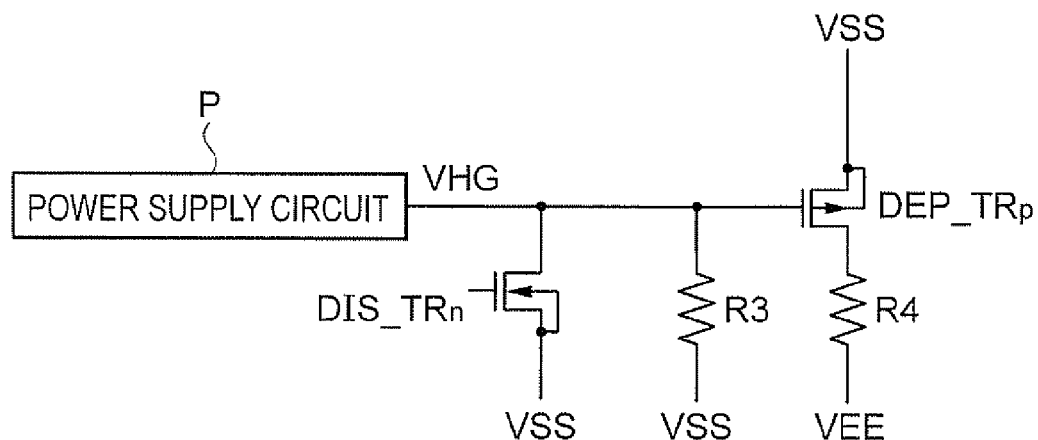
FIG. 5 is a diagram showing a configuration for preventing a latchup according to a second modified example.

The power supply circuit P also generates a high voltage VHG (e.g., +15V) shown in FIG. 5, which is higher than the power supply voltage VDD, based on the low voltage VEE.

The P-substrate PS is maintained in the low voltage VEE described above via the P-tap STp.

The N-well NW is formed in the P-substrate PS.

The NMOS transistor TRn is formed on a surface of the P-substrate PS, and the ground voltage VSS is applied to the source Sn (or the drain Dn) on the one hand, the low voltage VEE is applied to the drain Dn (or the source Sn) on the other hand.

The PMOS transistor TRp is formed on the surface of the N-well NW, and the power supply voltage VDD is applied to the source Sp.

The P-tap STp is provided with the low voltage VEE by the power supply circuit P as described above so as to provide the low voltage VEE to the P-substrate PS.

The N-tap STn is provided with the power supply voltage VDD so as to provide the power supply voltage VDD to the N-well NW.

In the semiconductor device S of the embodiment having the configuration described above, first and second parasitic transistors tr1, tr2 are formed among the PMOS transistor TRp, the P-substrate PS, the NMOS transistor TRn, and the N-well NW. Similarly to the semiconductor device of the related art described above, even when the power supply voltage VDD is applied to the power supply circuit P to which the power supply voltage VDD has not been applied yet, the power supply circuit outputs the low voltage VEE, the proper voltage (−10V), not immediately after the application of the power supply voltage VDD but after a brief interval from the application thereof. When the P-tap STp becomes at a voltage (0.7V or more higher than the ground voltage VSS as the emitter voltage) enough for bringing the first parasitic transistor tr1 into a conductive state before the output of the low voltage VEE as the proper voltage is started due to the fact that the power supply voltage VDD is applied to the N-tap STn, and that a parasitic capacitance exists between the P-substrate PS and the N-well NW, the first parasitic transistor tr1 becomes in a conductive state. Thus, the base voltage of the second parasitic transistor tr2 drops as low as to bring the second parasitic transistor tr2 into a conductive state, as a result, the second parasitic transistor tr2 also becomes in a conductive state, and finally, both of the first and second parasitic transistors become in the conductive state. As illustrated with the arrow in FIG. 1, these two transistors in the conductive state might cause a latchup between the power supply voltage VDD and the ground voltage VSS. In short, when the voltage of the P-tap STp becomes 0.7V or higher before the low voltage VEE is applied to the P-tap STp as the proper voltage due to the application of the power supply voltage VDD and existence of the parasitic capacitance, both of the first and second parasitic transistors tr1, tr2 become in the conductive conditions, thus a latchup between the power supply voltage VDD and the ground voltage VSS might be caused.

Figure 2:
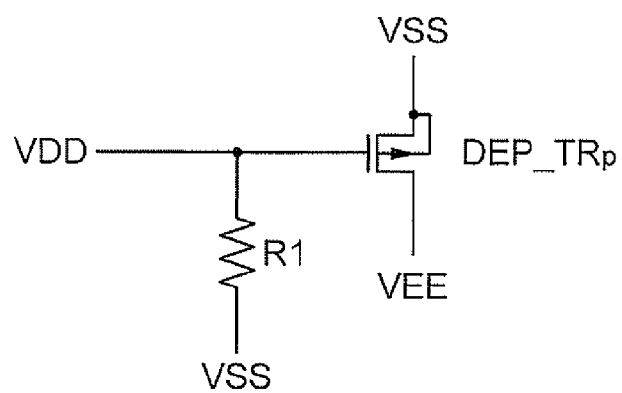
FIG. 2 is a diagram showing a configuration for preventing a latchup according to an embodiment of the invention.

The semiconductor device S of the embodiment has a configuration as shown in FIG. 2, which is different from that of the related art, in addition to the basic configuration described above similar to that of the related art in order for preventing the latchup described above. The semiconductor device S of the embodiment further includes a depression-type PMOS transistor DEP_TRp and a resistor R1, in detail, and the depression-type PMOS transistor DEP_TRp has the source connected to the ground voltage VSS, the drain connected to the low voltage VEE, and the gate connected to the power supply voltage VDD, and further, the resistor R1 is disposed between the gate of the depression-type PMOS transistor DEP_TRp and the ground voltage VSS so as to be able to substantially provide the ground voltage VSS to the gate of the depression-type PMOS transistor DEP_TRp.

Operation and Effectiveness

In the semiconductor device S of the embodiment, since the transistor DEP_TRp is of the depression type and the gate voltage thereof is provided with the ground voltage VSS from the beginning, namely before the power supply voltage VDD is applied thereto, by the resistor R1, the depression-type PMOS transistor DEP_TRp is in a conductive state from the beginning, and as a result, the P-tap STp is provided with the ground voltage VSS from the beginning. Thus, although there is a possibility that the voltage of the P-tap STp might rise to +0.7V or higher by application of the power supply voltage VDD, more precisely by application of the power supply voltage to the N-tap STn during a period from application of the power supply voltage VDD to when the power supply circuit outputs the proper low voltage VEE, the voltage of the P-tap STp is kept provided with the ground voltage VSS by the depression-type PMOS transistor DEP_TRp in the conductive state, namely is prevented from becoming +0.7V or higher. As a result, the first parasitic transistor tr1 is prevented from becoming in the conductive state, thus the second parasitic transistor tr2 is also prevented from becoming in the conductive state, as a result, the latchup between the power supply voltage VDD and the ground voltage VSS as illustrated with the arrow in FIG. 1 can be prevented.

Figure 3:
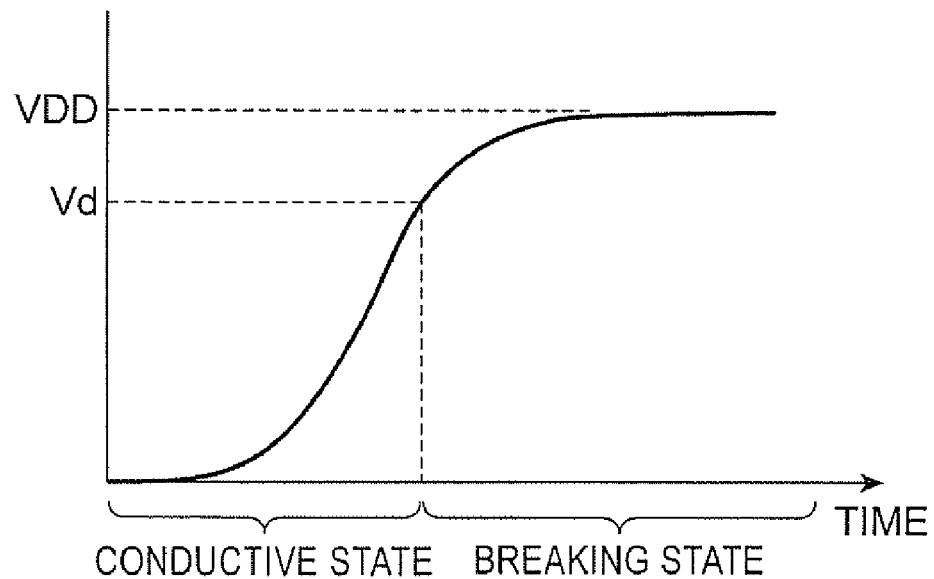
FIG. 3 is a diagram showing an operation of the configuration for preventing a latchup according to an embodiment of the invention.

After application of the power supply voltage VDD, the power supply voltage VDD rises from 0V towards +2.8V, and when the power supply voltage VDD reaches a predetermined voltage Vd, the depression-type PMOS transistor DEP_TRp is switched from the conductive state to the breaking state as shown in FIG. 3, as a result the P-tap STp is separated from the ground voltage VSS, and is thereafter maintained to be at −10V.

In the semiconductor device S of the embodiment, if the gate voltage of the depression-type PMOS transistor DEP_TRp is provided with roughly the ground voltage VSS from the beginning, a similar advantage as described above can be obtained without using the resistor 1.

FIRST MODIFIED EXAMPLE

Figure 4:
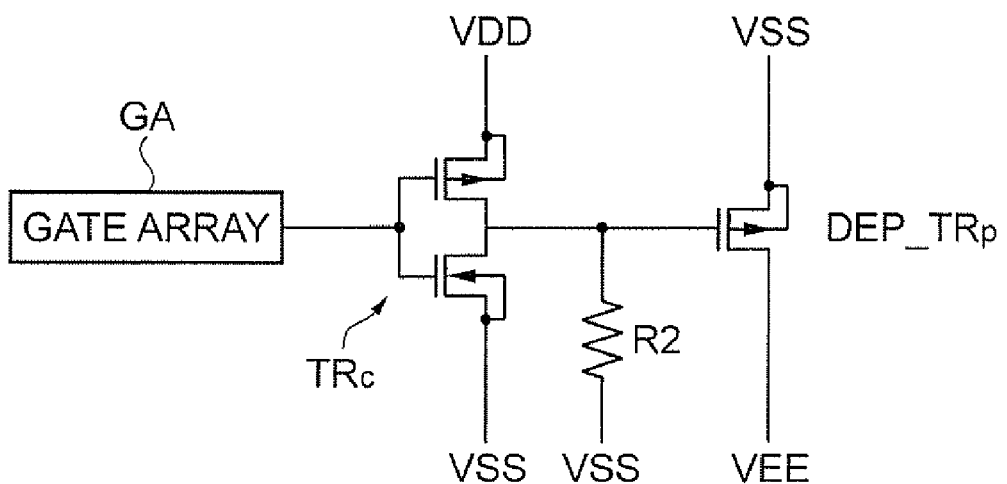
FIG. 4 is a diagram showing a configuration for preventing a latchup according to a first modified example.

The semiconductor device of a first modified example has a similar configuration to that of the semiconductor device S of the embodiment shown in FIG. 1, and in addition, a unique configuration to the first modified example shown in FIG. 4 instead of the configuration of the embodiment shown in FIG. 2. The semiconductor device of the first modified example includes, in more detail, the depression-type PMOS transistor DEP_TRp having the source connected to the ground voltage VSS and the drain connected to the low voltage VEE, and a resistor R2 disposed between the gate of the depression-type PMOS transistor DEP_TRp and the ground voltage VSS similarly to the case with the semiconductor device S of the embodiment on the one hand, and it also includes a gate array GA, and a CMOS transistor TRc disposed between the gate array GA and the depression-type PMOS transistor DEP_TRp differently from the case with the semiconductor device S of the embodiment on the other hand.

In the semiconductor device in the first modified example, the gate array GA controls the switching condition of the CMOS transistor TRc so that the CMOS transistor TRc outputs the ground voltage VSS from the beginning, thus the depression-type PMOS transistor DEP_TRp is in the conductive state from the beginning, and as a result, the low voltage VEE is provided with the ground voltage VSS from the beginning, and thus, the latchup between the power supply voltage VDD and the ground voltage VSS can be prevented in the same manner as in the case with the semiconductor device S of the embodiment.

In the semiconductor device of the first modified example, after the power supply voltage VDD is applied, and when the power supply voltage VDD is reaching the predetermined voltage Vd, for example as shown in FIG. 3, the gate array GA controls the switching condition of the CMOS transistor TRc so that the CMOS transistor TRc outputs the power supply voltage VDD, thus the depression-type PMOS transistor DEP_TRp becomes in the breaking state, as a result, the P-tap STp is thereafter separated from the ground voltage VSS, and is maintained to be at the voltage provided by the proper low voltage VEE.

If the gate voltage of the depression-type PMOS transistor DEP_TRp is maintained substantially at the ground voltage VSS from the beginning without the resistor R2, as in the case with the resistor R1 of the embodiment, the advantage described above can be obtained without providing the resistor R2.

SECOND MODIFIED EXAMPLE

The semiconductor device of a second modified example has the configuration of the semiconductor device S of the embodiment shown in FIG. 1, and in addition, a unique configuration to the second modified example shown in FIG. 5 instead of the configuration of the embodiment shown in FIG. 2. The semiconductor device of the second modified example includes, in more detail, the depression-type PMOS transistor DEP_TRp having the source connected to the ground voltage VSS and the drain connected to the low voltage VEE, and a resistor R3 disposed between the gate of the depression-type PMOS transistor DEP_TRp and the ground voltage VSS similarly to the case with the semiconductor device S of the embodiment on the one hand, the gate of the depression-type PMOS transistor DEP_TRp is provided with (1) a high voltage VHG from the power supply circuit P, (2) a discharging NMOS transistor DIS_TRn disposed between the gate and the ground voltage VSS, and the drain of the depression-type PMOS transistor DEP_TRp is provided with (3) a resistor 4 disposed between the drain and low voltage VEE differently from the case with the semiconductor device S of the embodiment on the other hand.

In the semiconductor device of the second modified example, similarly to the case with the semiconductor device S of the embodiment, since the gate of the depression-type PMOS transistor DEP_TRp is provided with the ground voltage VSS by the resistor R3 from the beginning, the depression-type PMOS transistor DEP_TRp is in the conductive state from the beginning, thus the low voltage VEE is provided with the ground voltage VSS in the beginning. Therefore, the latchup between the power supply voltage VDD and the ground voltage VSS caused by the application of the power supply voltage VDD can be prevented.

In the semiconductor device of the second modified example, after the power supply voltage VDD is applied, when the power supply circuit P starts outputting the proper high voltage VHG, the gate of the depression-type PMOS transistor DEP_TRp is provided with the high voltage VHG, thus the depression-type PMOS transistor DEP_TRp is switched from the conductive state to the breaking state, as a result, the P-tap STp is maintained to be at a voltage provided by the low voltage VEE.

The resistor 4 has a function of limiting a current between the ground voltage VSS and the low voltage VEE, and since the low voltage VEE, which has reached the proper value, is necessary for the power supply circuit P to generate the high voltage VHG, the resistor 4 is provided for preventing the case in which the low voltage VEE is fixed to the ground voltage VSS, and the power supply circuit P is not allowed to generate the proper low voltage VEE, and consequently is not allowed also to generate the high voltage VHG.

The discharging NMOS transistor DIS_TRn has a function of discharging the charge, which has been accumulated in the gate of the depression-type PMOS transistor DEP_TRp by application of the power supply voltage VDD at this time, prior to application of the power supply voltage VDD at the next time in the similar manner, after applying the power supply voltage VDD to operate the semiconductor device and then breaking the power supply voltage VDD at this time. According to such a function, the case in which the gate voltage of the depression-type PMOS transistor DEP_TRp is nearly the high voltage VHG prior to the application of the power supply voltage VDD at the next time, and consequently the depression-type PMOS transistor DEP_TRp is in the breaking state from the beginning can be prevented.

THIRD MODIFIED EXAMPLE

Figure 6:
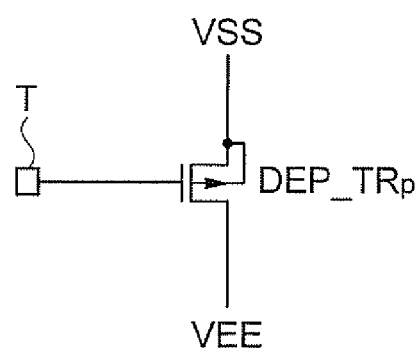
FIG. 6 is a diagram showing a configuration for preventing a latchup according to a third modified example.

The semiconductor device of a third modified example has the configuration of the semiconductor device S of the embodiment shown in FIG. 1, and in addition, a unique configuration to the third modified example shown in FIG. 6 instead of the configuration of the embodiment shown in FIG. 2. The semiconductor device of the third modified example includes, in more detail, the depression-type PMOS transistor DEP_TRp having the source connected to the ground voltage VSS and the drain connected to the low voltage VEE similarly to the case with the semiconductor device S of the embodiment on the one hand, and it also includes an external terminal T connected to the gate of the depression-type PMOS transistor DEP_TRp differently from the case with the semiconductor device S of the embodiment on the other hand. Here, the external terminal T receives a voltage input for switching the depression-type PMOS transistor DEP_TRp between the conductive state and the breaking state from the outside of the semiconductor device.

In the semiconductor device of the third modified example, by receiving the voltage (e.g., the ground voltage VSS) for bringing the depression-type PMOS transistor DEP_TRp into the conductive state, for example, in the external terminal T from the beginning, the depression-type PMOS transistor is in the conductive state from the beginning, thus the low voltage VEE is maintained to be at the ground voltage VSS. Thus, the latchup between the power supply voltage VDD and the ground voltage VSS can be prevented similarly to the case with the semiconductor device S of the embodiment.

After the power supply voltage VDD is applied, and when the power supply voltage VDD is reaching the predetermined voltage Vd, similarly to the case with the semiconductor device S of the embodiment, by receiving the voltage (e.g., the power supply voltage VDD) for bringing the depression-type PMOS transistor DEP_TRp into the breaking state in the external terminal T, the depression-type PMOS transistor DEP_TRp becomes in the breaking state, as a result, the P-tap STp is separated from the ground voltage VSS, and is thereafter maintained to be at the voltage provided by the low voltage VEE.

What is claimed is:

1. A semiconductor device, comprising:
   a P-substrate;
   an N-well disposed in the P-substrate;
   an NMOS transistor disposed in the P-substrate and having one of a source and a drain connected to a ground voltage;
   a P-tap disposed in the P-substrate and connected to a low voltage so as to provide the P-substrate with the low voltage to be lower than the ground voltage;
   a PMOS transistor disposed in the N-well and having a source connected to a power supply voltage;
   an N-tap disposed in the N-well and connected to the power supply voltage so as to provide the N-well with the power supply voltage; and
   a depression-type PMOS transistor having a drain connected to the low voltage and a source connected to the ground voltage so as to prevent a parasitic transistor, which may exist among the PMOS transistor, the N-well, the NMOS transistor, and the P-substrate, from causing a latchup between the power supply voltage and the ground voltage due to the low voltage rising higher than the ground voltage, and for becoming in a conductive state brought by a gate substantially connected to the ground voltage to maintain the low voltage to be substantially at the ground voltage until a possibility that the low voltage rises higher than the ground voltage is eliminated.

2. The semiconductor device according to claim 1, wherein the depression-type PMOS transistor is switched from the conductive state to a breaking state by application of the power supply voltage to the gate of the depression-type PMOS transistor.

3. The semiconductor device according to claim 1, further comprising
   a CMOS transistor connected to the gate of the depression-type PMOS transistor,
   wherein the depression-type PMOS transistor is switched between the conductive state and the breaking state by switching the voltage applied to a gate of the CMOS transistor.

4. The semiconductor device according to claim 1, further comprising
   a power supply circuit for generating a high voltage higher than the power supply voltage from the power supply voltage and the ground voltage,
   wherein the gate of the depression-type PMOS transistor is connected to the high voltage, and
   the depression-type PMOS transistor is switched from the conductive state to a breaking state by application of the high voltage to the gate of the depression-type PMOS transistor.

5. The semiconductor device according to claim 4, further comprising
   a discharging transistor disposed between the gate of the depression-type PMOS transistor and the ground voltage and for discharging a charge which may be accumulated in the gate of the depression-type PMOS transistor.

6. The semiconductor device according to claim 1, further comprising
   an external terminal disposed on the gate of the depression-type PMOS transistor, to which a voltage for bringing the depression-type PMOS transistor into the conductive state and a voltage for bringing the depression-type PMOS transistor into the breaking state are selectively applied.

* * * * *